United States Patent [19]

Slack

[11] 4,189,820
[45] Feb. 26, 1980

[54] TEMPLATE PATTERN ALIGNMENT

[76] Inventor: Otto G. Slack, 14 SE. 199th, Portland, Oreg. 97233

[21] Appl. No.: 879,219

[22] Filed: Feb. 21, 1978

[51] Int. Cl.² ............................................... B23P 17/00
[52] U.S. Cl. ......................................... 29/425; 29/407
[58] Field of Search ................. 29/407, 425, 701, 738; 156/256; 33/174 B, 174 G; 101/128.1, 128.4, 129; 355/26, 74

[56] References Cited

U.S. PATENT DOCUMENTS 1,843,432   2/1932   Nickerson .............................. 29/425

*Primary Examiner*—Lowell A. Larson
*Attorney, Agent, or Firm*—Kolisch, Hartwell, Dickinson & Stuart

[57] ABSTRACT

A method for enabling simple, reverse-side alignment of a pair of templates for electrical circuit patterns which are to be placed on the opposite sides of a double-sided printed circuit board. The method proposes, first, placing the templates for such patterns in pattern-aligned, confronting relationship, followed by trimming of a pair of intersecting margins in the templates to produce an angle of intersection therebetween which matches the angle of intersection of a pair of selected edges in such a board. The trimmed templates are then fitted on opposite sides of the board, with the templates' trimmed edges flush with the board's selected edges.

5 Claims, 3 Drawing Figures

TEMPLATE PATTERN ALIGNMENT

BACKGROUND AND SUMMARY OF THE INVENTION

This invention pertains to the alignment of patterns, such as the alignment of electrical circuit patterns which are to be placed on the opposite sides of a double-sided printed circuit board.

In the field of electronics, so-called printed circuit boards are in relatively widespread use. These boards are typically formed of a thin sheet-like insulative web, on one or both sides of which are strips of conductive material which form an electrical circuit pattern adapted to receive various electrical components that are mounted on the board. Where double-sided printed circuit boards are used, i.e., those wherein conductive circuit patterns exist on opposite sides of the board, alignment of the patterns (on the opposite sides of the board) is critical.

A typical double-sided printed circuit board, before it has any circuit patterns thereon, takes the form of a thin, sheet-like insulative web, on the opposite sides of which are bonded layers of a conductive material, such as copper. Circuit pattern layouts for the two sides of the board are prepared in a suitable manner, and photographic reproductions of these layouts are then made which are employed in a photo-etching process to remove copper from the two layers on the board selectively so as to leave on the opposite sides of the board the desired circuit patterns.

In the past, the problem of producing proper reverse-side alignment of these pattern layouts has been solved through the use of relatively expensive jigs and the like, and through time-consuming and costly techniques such as the drilling of alignment holes, and the use of alignment pins in conjunction with such holes and jigs.

A general object of the present invention is to provide a novel method for facilitating reverse-side alignment of such pattern layouts, which method can be performed simply, quickly, and without the use of costly and elaborate equipment.

The method of the invention rests on the concept that a pair of intersecting edges in a particular circuit board may be used as a guide for promoting pattern alignment. Simply stated, the method proposes first, and after completion of photographic pattern templates or layouts by conventional techniques, the placing of such templates in aligned, confronting relationship, as by setting the templates face-to-face against each other and shifting them relative to one another until the patterns thereon are properly aligned. This can easily and quickly be done by hand and by looking through the usual photographic pattern negatives to confirm alignment. Preferably, a releasably gripping adhesive is used in the space between the confronting faces, and the aligned templates are temporarily stuck together.

Following alignment of the templates as just described, a pair of intersecting margins therein are trimmed to produce an angle of intersection therebetween which matches the angle of intersection of a pair of selected edges in the board onto which the patterns of the templates are to be placed. The trimmed templates are then separated, and suitably fitted on opposite sides of the board, with their "trimmed" edges flush with the two selected intersecting edges of the board. Photo-exposure, developing and etching of the board is then performed in a conventional manner.

Through utilizing this technique, it will be obvious that extremely accurate reverse-side pattern alignment can be achieved. Further, it will be obvious that such alignment can be achieved in an extremely quick and simple manner, and without the necessity of using expensive alignment equipment.

These and other objects and advantages which are attained by the invention will become more fully apparent as the description which now follows is read in conjunction with the accompanying drawings.

DESCRIPTION OF THE DRAWINGS

The three drawing figures illustrate different steps used herein in accordance with the method of the invention FIG. 1 showing the placing of photographic templates in confronting aligned relationship, FIG. 2 illustrating trimming of a pair of intersecting margins in such templates, and FIG. 3 illustrating placement of the trimmed templates on opposite sides of a double-sided printed circuit board.

DETAILED DESCRIPTION OF THE INVENTION

Figure 1:
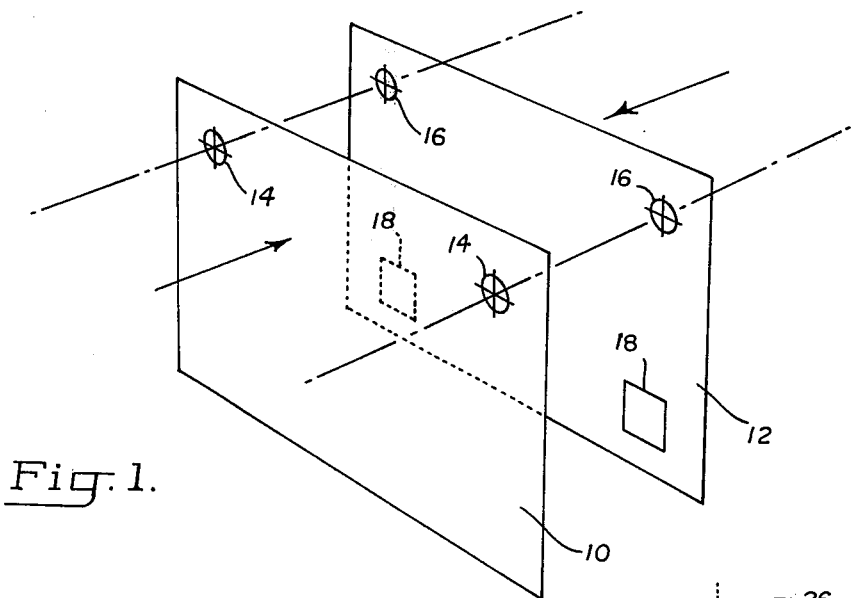

Turning now to the drawings, and referring first to FIG. 1, indicated at 10 and 12 are two electrical circuit-diagram pattern templates which have been prepared in accordance with conventional techniques. These templates show, photographically, two different circuit patterns which are intended to be placed, with proper alignment therebetween, on the opposite sides of a conventional double-sided printed circuit board. As is typically the case with such photographic templates, templates 10, 12 are provided with visual alignment cross hair targets, such as those shown at 14 for template 10, and those shown at 16 for template 12. In the past, such targets have been used in conjunction with jigs and the like in steps leading toward proper reverse-side pattern alignment. Those skilled in the art will appreciate that the sizes of, and spacing between, the two respective sets of targets are substantially the same. They will also appreciate that when the targets are aligned, so are the templates' patterns.

According to the present invention, targets 14, 16 are used in a quite different manner. More specifically, these targets are used herein to facilitate placing of templates 10, 12 in what might be referred to as pattern-aligned, confronting, parallel-planar relationship, as is indicated by the two opposing arrows which appear in FIG. 1. In other words, the templates are placed in face-to-face confronting relationship, and preferably in abutting or contacting confronting relationship, so that the cross hairs of targets 14 exactly align with the cross hairs of target 16. The templates are thus placed with respect to each other in such a manner that their patterns are oriented relative to one another in the same manner as is desired in the finally prepared circuit board.

Preferably, placing of pattern templates against one another as just described is followed by, or accompanied by, releasably securing the aligned templates as through the use of thin adhesive patches, such as those shown at 18, which have been prepared on that face of template 12 which confronts a face in template 10. While different available adhesives may be used for this purpose, one that has been found to be very effective is manufatured by Minnesota Mining & Manufacturing Co. and sold under the name "2 Mil High Tack Adhesive Transfer Tape No. 465".

Figure 2:
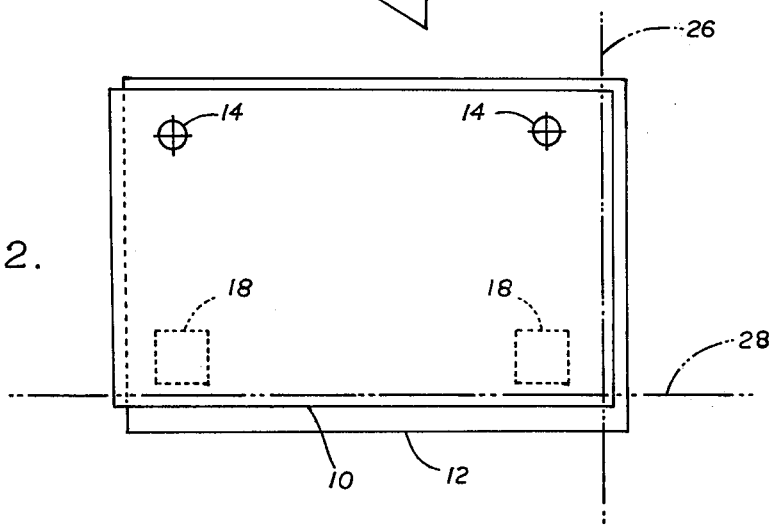

Referring to FIG. 2, this illustrates the situation which exists with templates 10, 12 releasably stuck together. It will not always be the case that the original, nominal outside dimensions of such templates will be the same. Further, it will not always be the case, even where the templates are of the same dimensions, that the alignment targets thereon will fall in the same respective corresponding locations. Thus, and to illustrate that such a condition indeed exists for templates 10, 12 it can be seen in FIG. 2 that the peripheral configurations of the templates are different, and that the specific locations thereon of the alignment targets are different. Nevertheless, it should be remembered that targets 14 are, in the condition illustrated in FIG. 2, exactly aligned with targets 16 in template 12.

Figure 3:
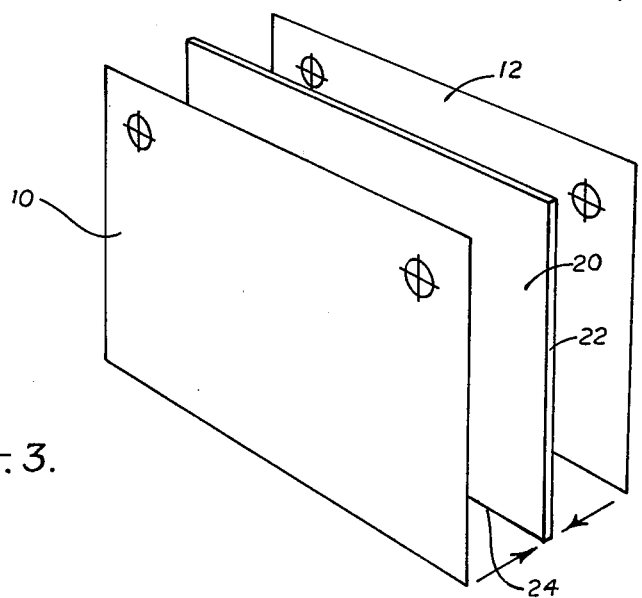

Referring to FIG. 3 along with FIG. 2, shown at 20 in FIG. 2 is a conventional double-sided printed circuit board which is ready to have circuit patterns etched onto its opposte sides. Board 20, as is normally the case with such boards, is rectangular and includes four substantially exactly right-angle corners. According to the invention, a pair of intersecting edges in the board is selected, and such pair in board 20 includes edges 22, 24. Such edges are selected so as to determine their angle of intersection at the corner which they define, and as has already been pointed out above, edges 22, 24 in board 20 define a substantially exact right angle.

With this information, and looking again particularly at FIG. 2, two intersecting margins in the stuck-together templates are trimmed along dash-double-dot lines 26, 28 as shown. These two lines are consciously placed angularly relative to one another to produce, after trimming of the templates, two sets of matching edges therein (one set for each template) which intersect at the known angle of intersection of the selected edges of the printed circuit board. It will thus be obvious that after trimming of the templates along lines 26, 28 the right and lower margins of the templates are flush with one another at the same time that the different patterns thereon are properly reverse-side aligned.

The templates are then separated, and, referring again to FIG. 3, suitably fitted against the opposite sides of board 20 with the edges in the templates which were trimmed along lines 26, 28, respectively, disposed flush with edges 22, 24, respectively, in the board. Again, a releasable adhesive material, such as that forming patches 18, may be used for this purpose. Photo-exposure, developing and etching of the opposite sides of board 20 then proceeds in a conventional manner.

It will thus be apparent that the method proposed by the present invention offers all of the features and advantages ascribed to it earlier. It is believed to be clearly evident that extremely simple and easily performed steps produce highly accurate alignment for reverse-side patterns. Further, while the method of the invention has been described in conjunction with a board or web having a selected right-angle corner of intersection between a pair of edges, it will be immediately aparent that it is usable with other specific angles of edge intersection.

Therefore, while a preferred method of practicing the invention has been described herein, it is appreciated that variations and modifications may be made without departing from the spirit of the invention.

It is claimed and desired to secure by letters patent:

1. A method of promoting reverse-side pattern alignment employing a pair of sheet-like pattern templates intended for use on opposite sides of a substantially planar web to place aligned patterns thereon, where the periphery of the web includes a pair of selected edges that intersect at a known angle, said method comprising
    placing such templates in pattern-aligned, confronting, parallel-planar relationship,
    simultaneously trimming a pair of intersecting margins in the confronting templates to produce matching edges therein which intersect at such known angle, and
    fitting the trimmed templates on opposite sides of the web with the matching edges in the templates flush with the selected edges in the web.

2. A method of promoting reverse-side pattern alignment employing a pair of sheet-like pattern templates intended for use on opposite sides of a substantially planar web to place aligned patterns thereon, where the periphery of the web includes a pair of selective edges that intersect at a known angle, said method comprising,
    releasably securing such templates in pattern-aligned, confronting, parallel-planar relationship,
    simultaneously trimming a pair of intersecting margins in the secured templates to produce matching edges therein which intersect at such known angle,
    separating the trimmed templates, and
    fitting the separated templates on opposite sides of the web with the matching edges in the templates flush with the selected edges in the web.

3. The method of claim 2, wherein said releasable securing is accomplised by releasably adhering the two templates to each other.

4. A method of for facilitating alignability in a pair of sheet-like pattern templates intended for use on opposite sides of a substantially planar web to place aligned patterns thereon, where the periphery of the web includes a pair of selected edges that intersect at a known angle, said method comprising
    placing such templates in pattern-aligned, confronting, parallel-planar relationship, and
    trimming a pair of intersecting margins in the confronting templates to produce matching edges therein which intersect as such known angle.

5. The method of claim 4 wherein said placing is accomplished by releasably adhering the two templates to each other.

* * * * *